US006940174B2

(12) United States Patent
Lin et al.

(10) Patent No.: US 6,940,174 B2
(45) Date of Patent: Sep. 6, 2005

(54) METALLIC PHOTONIC BOX AND ITS FABRICATION TECHNIQUES

(75) Inventors: Ching-Fuh Lin, Taipei (TW); Cha-Hsin Chao, Taipei (TW)

(73) Assignee: National Taiwan University, Taipei (TW)

( * ) Notice: Subject to any disclaimer, the term of this patent is extended or adjusted under 35 U.S.C. 154(b) by 35 days.

(21) Appl. No.: 10/746,908

(22) Filed: Dec. 23, 2003

(65) Prior Publication Data

US 2005/0133926 A1 Jun. 23, 2005

(51) Int. Cl.[7] .............................................. H01L 23/48
(52) U.S. Cl. ............................... 257/763; 257/E33.069
(58) Field of Search ......................... 257/763, E33.069

(56) References Cited

U.S. PATENT DOCUMENTS

2002/0131695 A1 * 9/2002 Masuda et al. ............... 385/27

* cited by examiner

*Primary Examiner*—David Nelms
*Assistant Examiner*—Tu-Tu Ho
(74) *Attorney, Agent, or Firm*—Raymond Y. Chan; David and Raymond

(57) ABSTRACT

A metallic photonic box capable of intensifying light at a certain wavelength, includes: a metallic surrounding forming a resonance chamber; and an insulator layer, disposed in the resonance chamber, having a predetermined dimension defining a cut-off wavelength, which inhibits light of a wavelength greater than the cut-off wavelength from resonating, whereby when the metallic photonic box is heated to generate light radiation, the light radiation is intensified at a wavelength rage predetermined by the cut-off wavelength.

23 Claims, 7 Drawing Sheets

METALLIC PHOTONIC BOX AND ITS FABRICATION TECHNIQUES

BACKGROUND OF THE PRESENT INVENTION

1. Field of Invention

The present invention relates to a metallic photonic box and its manufacturing processes, and more particularly to a metallic photonic box that improves the illumination efficiency of light radiation at a certain range of wavelength.

2. Description of Related Arts

Since 1879 when Thomas Edison invented the incandescent light, many efforts have been directed to its improvement of illumination efficiency, energy saving and cost of manufacturing. Given that more than 30 percent of electric power generated worldwide is used in lighting, an illumination apparatus having better illumination efficiency and saving more energy is much needed. This is particularly true when natural resources for generating electricity are exhausting rapidly in today's age.

An incandescent light, as one of the most frequently used illumination apparatuses, includes a tungsten filament having electric current running therethrough for heating to about 2,200 degrees Celsius, thereby generating light radiation. However, it has the shortcomings, such as fragile, less efficient, energy wasting and short living.

Due to the development of technology, fluorescent lights and light emitting diodes (LED) have been invented for better light sources.

Fluorescent Light

A fluorescent light is composed of an air-tight gas discharge tube with its two ends respectively attached with filaments coated with radiator, such as potassium oxide and calcium oxide, for discharging electrons. The gas discharge tube contains argon, neon and krypton added with mercury, having its inner surface coated with fluorescent compositions. When a sufficient voltage is applied to the two ends of the tube, the filaments emit electrons colliding with mercury atoms at a gas discharging state to release ultraviolet rays having a wavelength of 253.7 nm. The ultraviolet rays excite the coated fluorescent composition to generate visible light, whose wavelength depends on its exact composition. Thus, visible light of various colors may be produced by various fluorescent compositions, including yttrium oxide blended with europium, phosphoric lanthanum terbium blended with cerium, and barium, aluminum magnesium oxide blended europium. It is estimated that 60 percent energy of inputting electricity is converted into ultraviolet rays, and only 40 percent energy of the ultraviolet rays is converted into visible light, wherein the rest of the energy is wasted in the form of heat. In other words, the illumination efficiency of fluorescent light is about 24 percent, about twice the efficiency of incandescent light. Although the fluorescent light is energy saving, it is fragile and contains polluting waste.

LED

An LED has many advantages over the traditional incandescent light, including compact, less hot, less energy consuming, longer living and less delaying. However the LED is very selective in terms of material choosing and crystal growth, so the manufacture is difficult. In addition, the voltage required for LED is different from the usual incandescent light and fluorescent light, so additional voltage conversion and AC to DC vonversion is reauired, increasing the cost of LED utilization for illumination purpose. Even so, in order to save energy and protect environment, many developed countries have adopted the LED as the standard lighting device for the twenty first century. Because many countries' energy supply relies on import, there is a great market potential for LED lights. According to estimation, if Japan replaces all its incandescent lights with LED lights, it will save energy consumption for the approximate amount generated by two power plants, which will indirectly reduce the consumption of fuel by one billion liters. As a result, the carbon dioxide released in the course of power generating will also be reduced, thereby alleviating the greenhouse effect.

The issue of building a nuclear power plant has invited heated arguments in Taiwan, and raises the need of discovering new energy and improving energy-using efficiency. If one fourth of the illumination apparatuses can save about thirty percent of energy in Taiwan, 11-billions-kilowatt-per-hour power will be saved, which is about a nuclear power plant's annual capability of power generating. As a result, the carbon dioxide released and fuel consumed for power generation will be reduced accordingly.

Thus, what is needed is an illumination apparatus that can improve the illumination efficiency of the traditional illumination devices in order to save energy without additional efforts for voltage conversion and AC to DC vonversion.

SUMMARY OF THE PRESENT INVENTION

An objective of the present invention is to provide a metallic photonic box and its fabricating techniques, wherein the metallic photonic box defines a cut-off wavelength inhibiting light radiation having a wavelength greater than the cut-off wavelength from resonance.

Another objective of the present invention is to provide a metallic photonic box that is able to transform energy that would have been used for generation of light but for inhibition by the cut-off wavelength, so as to intensify the light radiation at a predetermined wavelength range.

The present invention discloses a metallic photonic box capable of intensifying light at a certain wavelength, comprising: a metallic surrounding forming a resonance chamber; and an insulator layer, disposed in the resonance chamber, having a predetermined dimension defining a cut-off wavelength, which inhibits light of a wavelength greater than the cut-off wavelength from resonating, whereby when the metallic photonic box is heated to generate light radiation, the light radiation is intensified at a wavelength rage predetermined by the cut-off wavelength.

The present invention further discloses a method of making a metallic photonic box for generating light intensified at a certain wavelength, comprising the following steps:

(a) forming a metal layer on a substrate;

(b) forming an insulator layer on the metal layer;

(c) forming a photo-resistor layer on the insulator layer;

(d) removing the insulator layer uncovered by the photo-resistor layer;

(e) thickening the metal layer on the insulator layer;

(f) removing the photo-resistor layer; and (g) forming a metal cover on the insulator layer.

These and other objectives, features, and advantages of the present invention will become apparent from the following detailed description, the accompanying drawings, and the appended claims.

DETAILED DESCRIPTION OF THE PREFERRED EMBODIMENT

The present invention discloses a metallic photonic box capable of intensifying a electromagnetic radiation at the wavelength range of visible light, wherein the metallic photonic box comprises:

a metallic surrounding forming a resonance chamber; and an insulator layer, disposed in the resonance chamber, having a predetermined dimension defining a cut-off wavelength, which inhibits light of a wavelength greater than the cut-off wavelength from resonating, whereby when the metallic photonic box is heated to generate light radiation, the light radiation is intensified at a wavelength rage predetermined by the cut-off wavelength.

Figure 1:
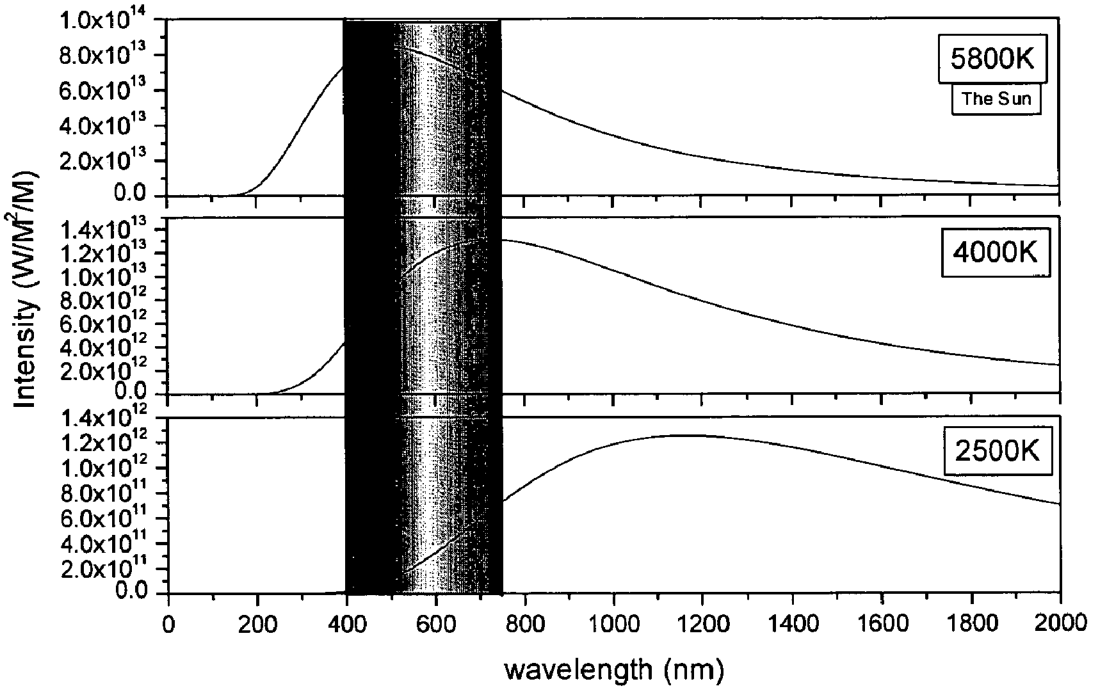
FIG. 1 is a spectrum diagram showing the black body radiation of an object at three various temperatures.

Referring to FIG. 1, when a piece of metal is heated to a high temperature, black body radiation occurs. The intensity of radiation depends on the temperature and the wavelength of the electromagnetic radiation, according to Planck's equation of black body radiation:

$$E(\lambda, T) = \frac{2\pi hc^2}{\lambda^5(e^{hc/\lambda kT} - 1)}$$

wherein $\lambda$ is wavelength, T is the absolute temperature, c is the speed of light, and others denote some basic physics coefficients. When the temperature increases, the peak intensity of the electromagnetic radiation shifts toward the left of the spectrum. As shown in FIG. 1, at the temperature of 2,500 K, the wave length of the peak intensity is about 1.2 μm, about the wavelength of infrared. At 4,000 K, the wavelength of the peak intensity shifts into the range of wavelength for visible light. At 5,800 K, the electromagnetic radiation appears as white light that is about the same wavelength of the radiation the sun emits.

The disclosed metallic photonic box defining a resonance chamber alters the behavior of black body radiation. The resonance chamber restrains the electromagnetic field in a metallic surrounding to generate a stationary wave by resonance, which is regulated according to the cut-off wavelength defined by the resonance chamber. According to electromagnetic theories, assuming the metallic photonic box is a cube, its wavelength is defined as:

$$\lambda_{klm} = \frac{2na}{\sqrt{k^2 + l^2 + m^2}}$$

wherein $\lambda_{klm}$ is the wavelength, a is the length of each side of the cubic resonance chamber, n is the refraction rate of the isolator disposed in the resonance chamber, k, l, m denote various mode numbers. For a main mode, i.e., the mode corresponds to the longest wavelength—cut-off wavelength, the above equation can be simplified as:

$$\lambda_{klm} = \sqrt{2}na$$

For example, assuming the refraction rate of the insulator n is 1.5, in order to have a metallic photonic box emitting blue light having a wavelength of 467 nm, the length of the cube a is about 220 nm. If the metallic photonic box is in a shape other than a cube, the same effect can be achieved by calculating the cut-off wavelength according to other electromagnetic theories.

The disclosed metallic photonic box can transfers the energy for certain wavelength to another range of wavelength, so that the light radiation of such range can be intensified. The dimension of the metallic photonic box can be varied for application to areas other than illumination. For example, the metallic photonic box can be used in the area of telecommunication to generate infrared having a wavelength of 1.55 μm. One advantage of the invention is that the metallic photonic box can generate light of various colors simply by varying its dimension. Thus, the metallic photonic box is easier to generate light of various colors than traditional lights.

Accordingly, the metallic photonic box can be formed in any shapes other than a cube, such as a rectangular body, sphere, elliptical body, pyramid and other geometric bodies possibly made by semiconductor manufacturing processes. It is noted that the cubic shape is preferred.

The metallic surrounding of the metallic box is preferred to have a thickness between 1 nm and 10 μm. The metal selected for the metallic photonic box can be any kinds of high fusion temperature, such as tungsten, platinum and gold. The insulator includes, but not limited to, silicon dioxide, silicon nitride, titanium dioxide, air and vacuum.

The disclosed metallic photonic box can be spread on the tungsten filament of incandescent light by semiconductor manufacturing process to increase the illumination efficiency and save energy. Because the traditional incandescent light only converts about five percent energy to visible light, the metallic photonic box improves the illumination efficiency by concentrating most of energy in generating visible light. If the metallic photonic box is widely used in industries and households, the energy saved may amount to the capacity of a nuclear power plant.

The invention discloses a method of making the metallic photonic box, comprising the following steps:

(a) forming a metal layer on a substrate;

(b) forming an insulator layer on the metal layer;

(c) forming a photo-resistor layer on the insulator layer;

(d) removing the insulator layer uncovered by the photo-resistor layer;

(e) thickening the metal layer on the insulator layer;

(f) removing the photo-resistor layer; and (g) forming a metal cover on the insulator layer.

According to step (a), the substrate is made of a material includes, but not limited to, silicon, glass, metal and other thermo-conductive materials. In step (a), the preferable thickness of the metal layer is between 5 nm and 1 $\mu$m.

According to step (b), the insulator is formed on the metal layer by means of plasma enhanced chemical vapor deposition (PECVD), chemical vapor deposition, sputtering or spin-on coating.

According to step (c), the photo-resistor layer is formed on the insulator layer by means of photolithography, electron-beam lithography, ion-beam lithography, atomic force lithography or scanning tuning electron lithography.

Accordingly, the metal layer and metal cover are preferably made of materials of high fusion temperature, such as platinum, tungsten and gold.

According to step (g), the thickness of metal cover is between 1 nm and 500 nm.

When a cubic metallic photonic box is wanted, the thickness of the insulator layer should be 50 percent of the desired wavelength, and each square of the photo-resistor layer has a side of 50 percent of the desired wavelength. In step (e) the thickness of the insulator layer is no greater than that of the insulator layer in step (e).

The disclosed metallic photonic box can be coated on a tungsten filament, through which an electric current runs to generate heat for the metallic photonic box to generate black body radiation. The resonance chamber defined in the metallic photonic box improves the illumination efficiency of visible light and saves energy.

Thus, the present invention further discloses a light source comprising:

a black body radiator having a metallic photonic box having a predetermined dimension of nanometer degree; and a heat source for heating the metallic photonic box, wherein the metallic photonic box provides a cut-off wavelength to inhibit light of a wavelength greater than the cut-off wavelength from resonating in the metallic photonic box.

Figure 2:
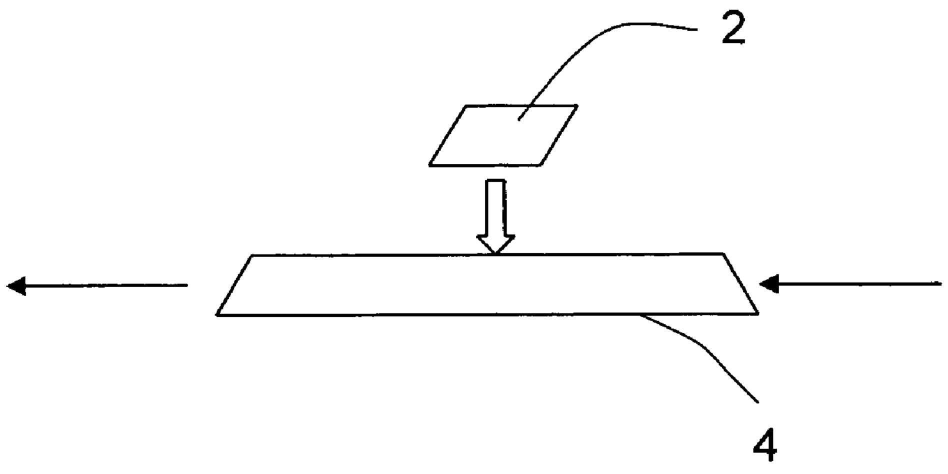
FIG. 2 is a schematic illustration showing a metallic photonic box heated on a substrate.

The disclosed light source is further explained in the following paragraphs:

Referring to FIG. 2, the metallic photonic box 2 is placed on a conductive base 4 made of materials having high fusion temperature, such as tungsten and graphite. An electric voltage is applied to the base 4, which is placed in a vacuum environment, in order to generate heat.

Figure 3:
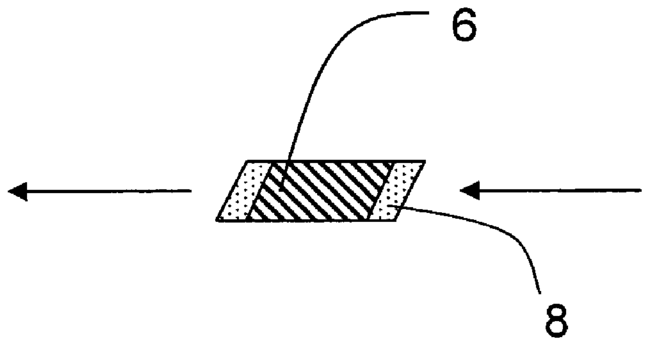
FIG. 3 is a schematic illustration showing a metallic photonic box embedded on a substrate, which is thermo-electrical conductive, for heating.

As an alternative shown in FIG. 3, the metallic photonic box 6 is directly embedded in a conductive base 8 made of materials having high fusion temperature, such as tungsten and graphite. An electric voltage is applied to the base for generating heat.

The temperature required for the metallic photonic box to function properly is lower than the traditional lights, because it alters the spectrum of black body radiation and enhances the wavelength of visible light. In other words, in order to achieve the same intensity of visible light, the metallic photonic box requires lower energy than the traditional lights. Moreover, the metallic photonic box is packed in a vacuum environment, whose pressure is far lower than 1 torr, to reduce its oxidation rate.

The color of the light radiated from the metallic photonic box may be varied by adjusting its dimension, according to the following electromagnetic equation:

$$\lambda_{klm} = \frac{2na}{\sqrt{k^2 + l^2 + m^2}}$$

wherein n is the refraction rate, a denotes the length of each side of the metallic photonic box, k, l, m are the various modes of the resonance chamber, having a minimum number as 0 or 1. For example, the metallic photonic box having a dimension of 300 nm generates red light; the one having a dimension of 250 nm generates green light; and the one having a dimension of 220 nm generates blue light. Arranging the metallic photonic boxes that generate red, green and blue light can collectively produce white light of high intensity. Those metallic photonic boxes may be formed on a substrate by semiconductor manufacturing processes for generating light of various colors, without using a complicated crystal growth process traditionally use for making LEDs.

The present invention has many applications. For example, the metallic photonic boxes of three various dimensions can be made on a substrate that is heated to generate white light, composed of red, green and blue light. The disclosed metallic photonic box is superior to the traditional incandescent lamps in the sense that it increases the illumination efficiency and having the light whiter than the traditional one. The metallic photonic box can also be used in liquid crystal displays as the background light source to reduce the size of the displays.

If the dimension of the metallic photonic box is fixed, the color of light it generates is fixed too. Thus, it could be suitable as traffic lights or signals. Because a traditional traffic light requires a tainted glass to generate light of certain colors, the disclosed metallic photonic box has the advantages of illumination efficiency and simplicity of manufacturing. This is true even comparing with the traffic light made by LEDs.

The disclosed metallic photonic box can be applied to make a display. Each box can be divided into many pixels. By controlling the electric current, the pixel may generate light of various colors. Because the metallic photonic box is smaller than 1 $\mu$m, the metallic photonic box can be used to make a high resolution display, which does not require background light source, color filter and liquid crystal materials that are usually needed for an LCD, such that its manufacturing is easier and cost is lower. Due to the elasticity of metal, the metallic photonic box is able to accommodate various contours of displays.

The metallic photonic box can be used to make telecommunication elements. In order to generate electromagnetic radiation having a wavelength of 1.55 $\mu$m that is generally required by telecommunication elements, the metallic photonic box can be made as a cube having a dimension of 730 nm for each side. Likewise, the disclosed metallic photonic box can be made to generate electromagnetic radiation with various wavelengths for applications in other areas.

EXAMPLE

Figure 4:
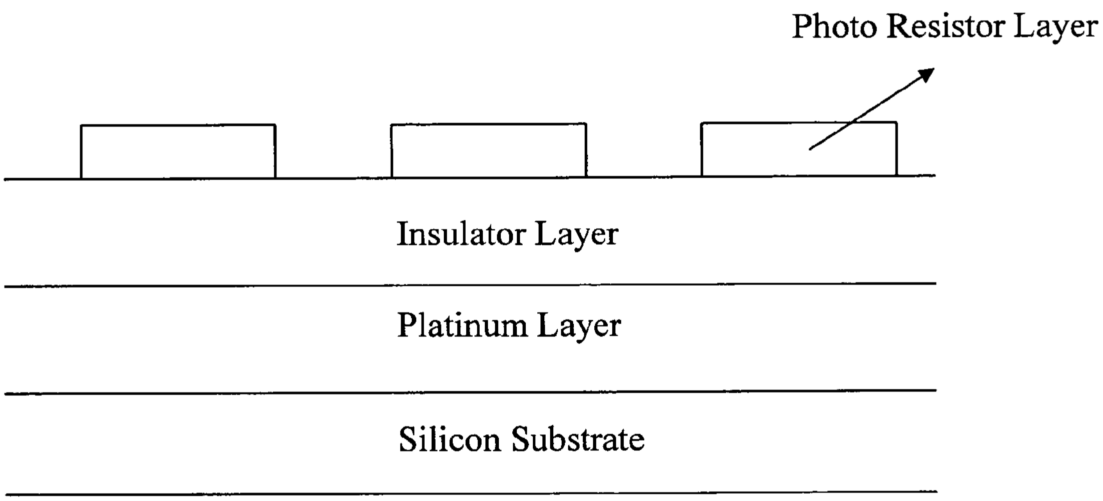
FIG. 4 is a schematic illustration of how the metallic photonic box is manufactured.

The following is an example detailing the manufacturing process of the disclosed metallic photonic box:

(1) Referring to FIG. 4, a platinum layer, having a thickness of about 100 nm, is sputtered on a silicon substrate, wherein it is noted that the substrate can be made of materials other than silicon.

(2) An insulator layer having a thickness of about 220 nm is formed on the platinum layer by spin-on coating.

Figure 5:
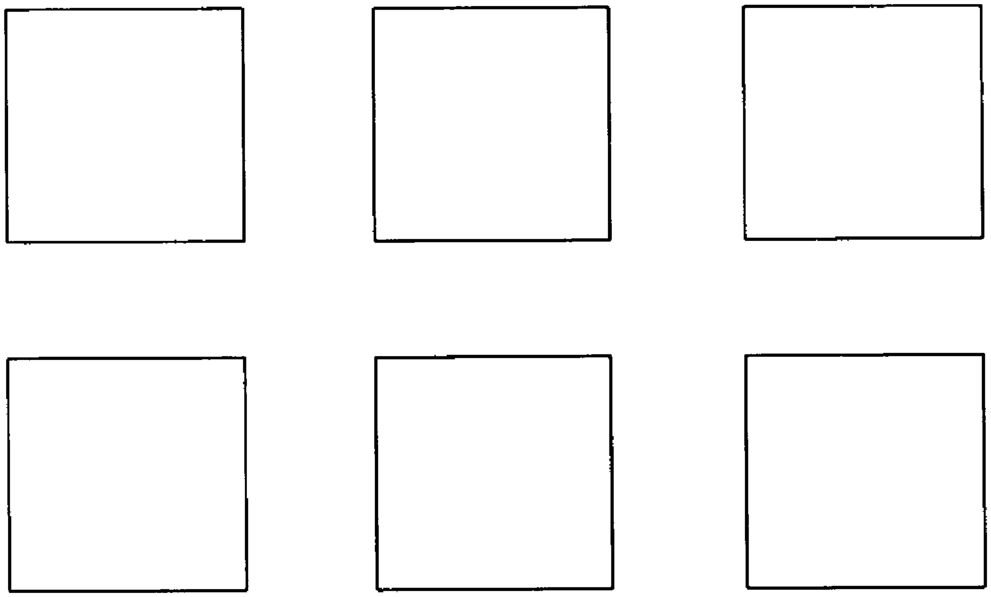
FIG. 5 is a top view of a photo-resistor layer according to FIG. 4.

(3) Referring to FIG. 5, a photo-resistor layer is formed on the insulator layer by means of electron-beam lithography, wherein the photo-resistor layer serves as a photo mask divided into squares having a dimension of 220 nm for each side and a gap of 100 nm between two neighboring cubes.

(4) The platinum layer uncovered by the photo-resistor layer is removed by means of reactive ion etching.

(5) A platinum layer having a thickness of 220 nm is sputtered thereon, and the photo-resistor layer is removed thereafter.

Figure 6:
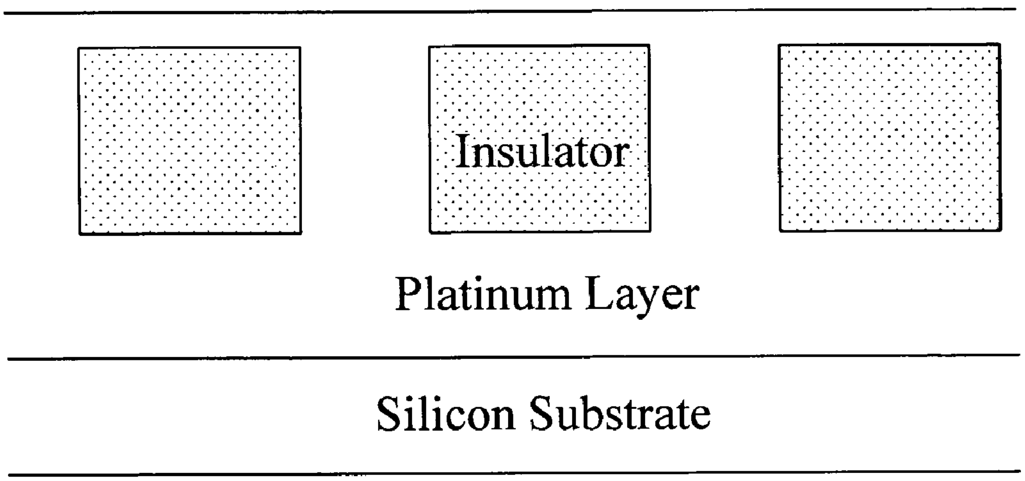
FIG. 6 is a cross-sectional view of the metallic photonic box according to a preferred embodiment of the present invention.

(6) Referring to FIG. 6, a metal cover having a thickness of 10 nm is sputtered thereon to complete the metallic photonic box.

Figure 7:
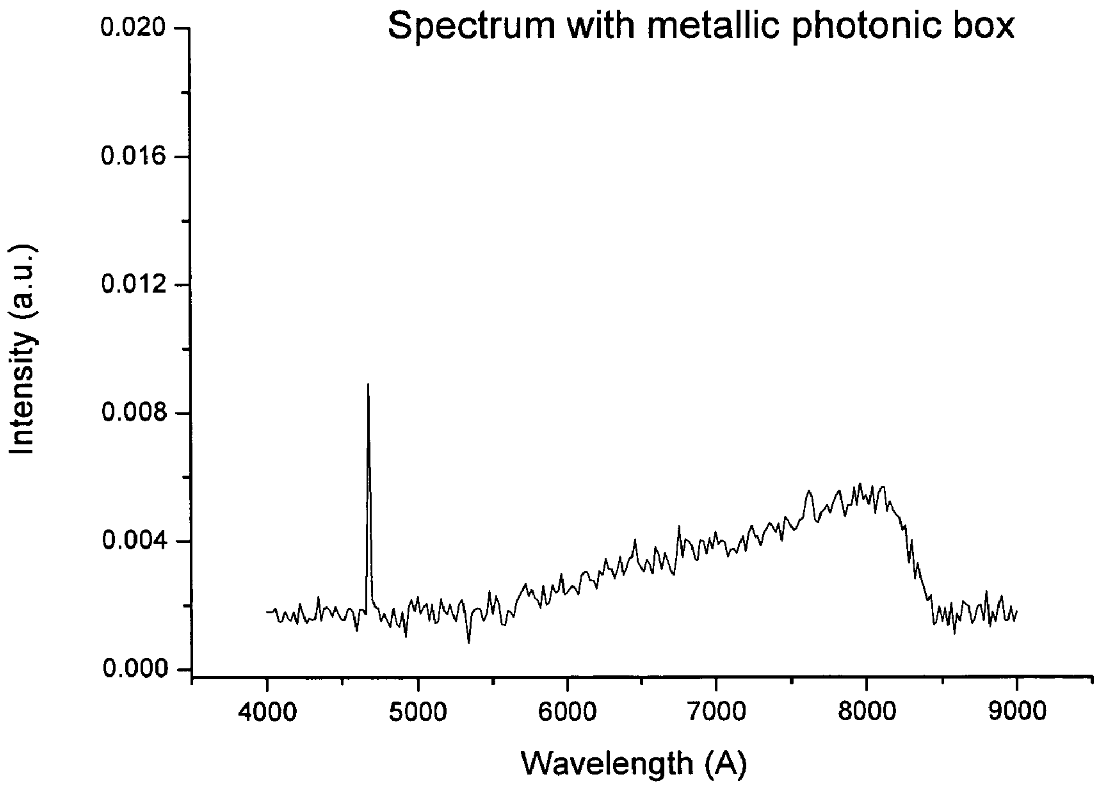
FIG. 7 is a spectrum of black body radiation of the metallic photonic box at about 700 degrees Celsius, wherein the electromagnetic radiation at wavelength of 467 nm is intensified for 5 or 6 times.
Figure 8:
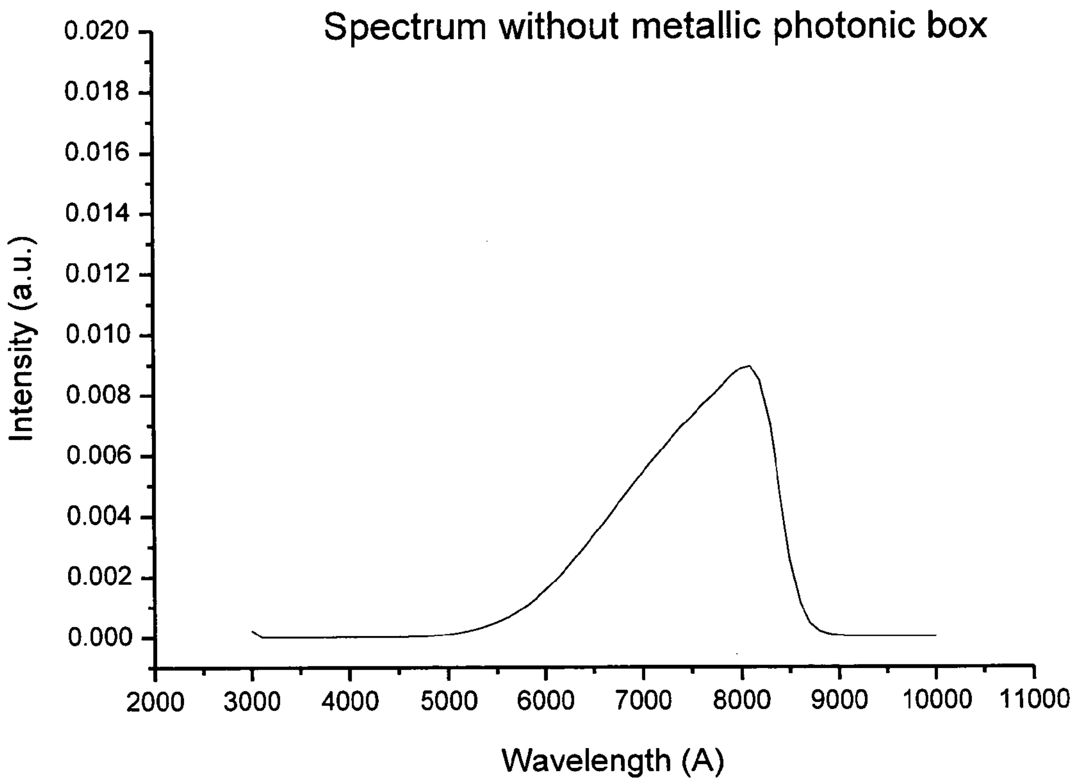
FIG. 8 is a spectrum of black body radiation of platinum without the metallic photonic box embedded at 700 degrees Celsius.

Referring to FIG. 7, the spectrum of the metallic photonic box heated to 700 degrees Celsius is shown. The electromagnetic radiation is inhibited for wavelength greater than 467 nm and its intensity at wavelength of 467 is intensified for about five or six times. Because the electromagnetic radiation at wavelength of 467 falls in the range of visible light, the disclosed metallic photonic box greatly improves the illumination efficiency. In other words, the metallic photonic box requires only one fifth of the energy to achieve the same intensity of illumination as the traditional metal in black body radiation. Referring to FIG. 8, the spectrum of a piece of platinum without the metallic photonic box embedded in black body radiation is shown, wherein the electromagnetic radiation is not intensified at the rage of visible wavelength.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A metallic photonic box capable of intensifying light at a certain wavelength, comprising:

a metallic surrounding forming a resonance chamber; and an insulator layer, disposed in said resonance chamber, having a predetermined dimension defining a cut-off wavelength, which inhibits light of a wavelength greater than said cut-off wavelength from resonating, whereby when said metallic photonic box is heated to generate light radiation, said light radiation is intensified at a wavelength rage predetermined by said cut-off wavelength.

2. The metallic photonic box, as recited in claim 1, transforming energy that would have been used for generation of light but for inhibition by the cut-off wavelength, so as to intensify said light radiation at said predetermined wavelength range.

3. The metallic photonic box, as recited in claim 1, is shaped as any one selected from a group consisting of cube, rectangular body, sphere, elliptical body, pyramid and other geometric bodies possibly made by semiconductor manufacturing processes.

4. The metallic photonic box, as recited in claim 1, wherein said insulator layer is made of a material selected from a group consisting of silicon dioxide, silicon nitride, titanium dioxide, air and vacuum.

5. The metallic photonic box, as recited in claim 1, wherein said metallic surrounding has a thickness between 1 nm and 10 μm.

6. The metallic photonic box, as recited in claim 1, wherein said metallic surrounding is made of a material selected from a group consisting of platinum, tungsten and gold.

7. A method of making a metallic photonic box for generating light intensified at a certain wavelength, comprising the following steps:

(a) forming a metal layer on a substrate;

(b) forming an insulator layer on said metal layer;

(c) forming a photo-resistor layer on said insulator layer;

(d) removing said insulator layer uncovered by said photo-resistor layer;

(e) thickening said metal layer on said insulator layer;

(f) removing the photo-resistor layer; and (g) forming a metal cover on said insulator layer.

8. The method, as recited in claim 7, wherein said substrate is made of a material selected from a group consisting of silicon, glass, metal and other thermo-conductive materials.

9. The method, as recited in claim 7, said metal layer has a thickness between 5 nm and 1 μm.

10. The method, as recited in claim 7, wherein said metal layer and said metal cover is made of a material selected from a group consisting of platinum, tungsten and gold.

11. The method, as recited in claim 7, wherein, in step (b), said insulator layer is formed on said metal layer by a process selected from a group consisting of plasma enhanced chemical deposition, vapor deposition, sputtering and spin-on coating.

12. The method, as recited in claim 7, wherein, in step (c), said photo-resistor layer is formed on said insulator layer by a process selected from a group consisting of photolithography, electron-beam lithography, ion-beam lithography, atomic force lithography and scanning tuning electron lithography.

13. The method, as recited in claim 7, wherein said metallic photonic box is shaped as any one selected from a group consisting of cube, rectangular body, sphere, elliptical body, pyramid and other geometric bodies possibly made by semiconductor manufacturing processes.

14. The method, as recited in claim 13, wherein said metallic photonic box is shaped as a cube.

15. The method, as recited in claim 14, wherein said insulator layer has a thickness about 50 percent of a desired wavelength of light.

16. The method, as recited in claim 14, wherein said photo-resistor layer is divided into squares having side length of about 50 percent of a desired wavelength of light.

17. The method, as recited in claim 14, wherein said insulator layer in step (e) has a thickness no greater than the thickness of said insulator in step (b).

18. The method, as recited in claim 7, wherein said metal cover has a thickness between 1 nm and 500 nm.

19. The method, as recited in claim 7, wherein said insulator layer is made of a material selected from a group consisting of silicon dioxide, silicon nitride, titanium dioxide, air and vacuum.

20. A light source comprising:

a black body radiator having a metallic photonic box having a predetermined dimension of nanometer degree; and a heat source for heating said metallic photonic box, wherein the metallic photonic box provides a cut-off wavelength to inhibit light of a wavelength greater than said cut-off wavelength from resonating in said metallic photonic box.

21. The light source, as recited in claim 20, wherein said metallic photonic box transforms energy that would have been used for generation of light but for inhibition by the cut-off wavelength, so as to intensify radiation of light at a predetermined wavelength range.

22. The light source, as recited in claim 20, wherein said metallic photonic box is shaped as any one selected from a group consisting of cube, rectangular body, sphere, elliptical body, pyramid and other geometric bodies possibly made by semiconductor manufacturing processes.

23. The light source, as recited in claim 20, wherein said metallic photonic box having a metallic surrounding that has a thickness between 1 nm and 10 $\mu$m.

* * * * *